United States Patent [19]
Nakagomi

[11] 3,990,018
[45] Nov. 2, 1976

[54] TRANSISTOR DIFFERENTIAL AMPLIFIER CIRCUIT

[75] Inventor: Yoshiyuki Nakagomi, Kodaira, Japan

[73] Assignee: Hitachi, Ltd., Japan

[22] Filed: Sept. 10, 1975

[21] Appl. No.: 611,892

[30] Foreign Application Priority Data
Sept. 13, 1974 Japan............................ 49-105023

[52] U.S. Cl. ............................ 330/30 D; 330/38 M
[51] Int. Cl.² .......................................... H03F 3/45
[58] Field of Search ...................... 330/30 D, 38 M; 307/299 B

[56] References Cited
UNITED STATES PATENTS
3,848,139  11/1974  Holt................................ 330/30 D

*Primary Examiner*—James B. Mullins
*Attorney, Agent, or Firm*—Craig & Antonelli

[57] ABSTRACT

In a transistor differential amplifier circuit wherein first and second lateral transistors are connected as loads between respective collectors of a pair of differential amplification transistors and a first power supply terminal, a common emitter of the amplifying transistors is connected to a second power supply terminal through common impedance means, the first lateral transistor is made a multicollector structure, and an output is derived from only one collector of the first lateral transistor, the improvement comprising the fact that the second lateral transistor is also made a multicollector structure and that a collector of the second lateral transistor as corresponds to the aforecited output collector of the first lateral transistor is connected to the second power supply terminal.

7 Claims, 8 Drawing Figures the differential input voltage - output current transfer characteristic.

TRANSISTOR DIFFERENTIAL AMPLIFIER CIRCUIT

FIELD OF THE INVENTION

This invention relates to a transistor differential amplifier circuit. More particularly, it relates to a transistor differential amplifier circuit which is improved in the differential input voltage - output current transfer characteristic.

DESCRIPTION OF THE PRIOR ART

Figure 4:
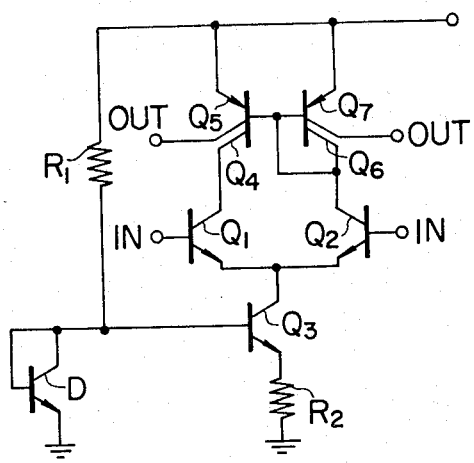
FIGS. 4 and 5 show examples of prior-art differential amplifier circuits, respectively.

In general, as amplifier circuits to be fabricated into semiconductor integrated circuits, differential amplifier circuits are extensively utilized. By way of example, a circuit as shown in FIG. 4 is known. In this case, constant-current circuits composed of lateral transistors $Q_4$, $Q_5$ and $Q_6$, $Q_7$ of the multicollector structure are usually used as the loads of differential amplification transistors $Q_1$ and $Q_2$. One transistor $Q_4$ ($Q_6$) in the multicollector structure functions as a constant-current supplying transistor, while the other transistor $Q_5$ ($Q_7$) serves to provide an output.

In case of intending to attain a high gain with the differential amplifier circuit, it has been a common practice to put the differential amplification transistors into the Darlington connection. The connection, however, increases a voltage required for the circuit and is often unfavorable.

Figure 5:
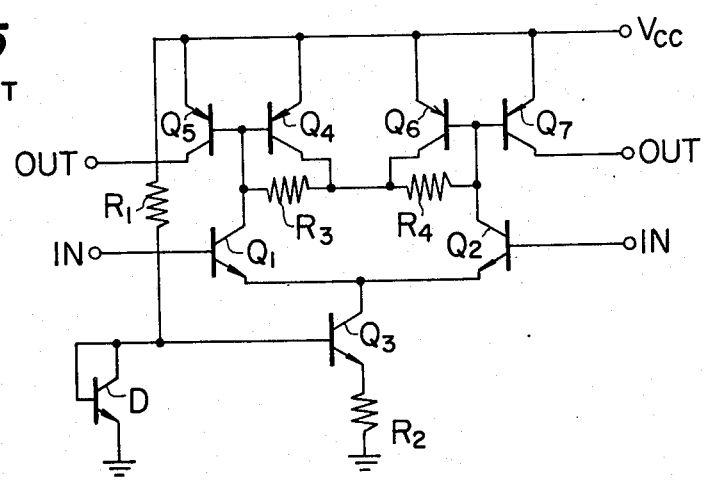

As a differential amplifier circuit which has solved this problem, there is known one disclosed in Japanese Patent Application Public-Disclosure No. 5328/1973 entitled "Current amplifier" as based on a patent application filed by Motorola Inc. (U.S.A.) (or U.S. Pat. 3,783,400 entitled "Differential current amplifier"). A circuit diagram of the differential amplifier circuit is illustrated in FIG. 5.

Figure 6:
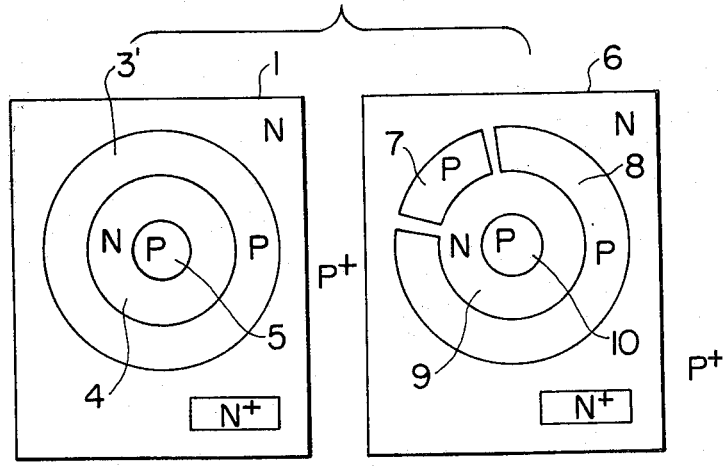
FIG. 6 shows an example of the pattern illustration of load transistors employed in the prior-art differential amplifier circuit.

As explained in the official patent gazette, this differential amplifier circuit exploits the current amplifying action of transistors $Q_4$ and $Q_6$ which function as loads. It is described in the published specification that when the circuit is to have a single output terminal, either output terminal can be omitted. In this respect, however, any example of a concrete circuit is not given in the gazette. In the case of omitting either output terminal in such differential amplifier circuit, it is usually carried out to form the collector of the lateral transistor into a ring. In a "PLL FM demodulator" under the trade name of MC131OP fabricated into a semiconductor integrated circuit by the aforementioned applicant for patent, the above differential amplifier circuit is utilized as a D.C. amplifier. (The details of the semiconductor integrated circuit are contained in Electronics/Nov. 22, 1971, pp 62 - 66.) Also in this case, as illustrated in FIG. 6, a transistor 6 for taking out an output is formed into the multicollector structure including P-type collector regions 7 and 8, while a transistor 1 with the output terminal omitted has a P-type collector region 3' shaped into a ring. In the figure, numerals 4 and 9 designate N-type base regions, and numerals 5 and 10 designate P-type emitter regions.

Figure 7:
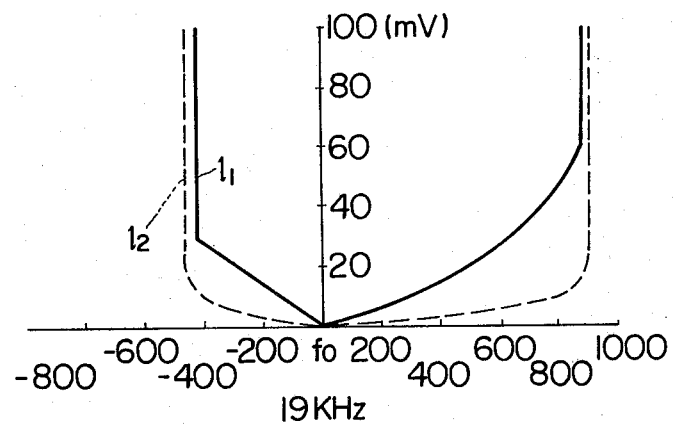
FIG. 7 is a graph which shows capture range and lock range characteristic curves of a prior-art PLL FM demodulator.

The inventors of the present application measured the capture range and lock range characteristics of the PLL (Phase Locked Loop) circuit of the product MC131OP. Then, it has been revealed that as illustrated by way of example in FIG. 7, the capture range characteristic $l_1$ (full line) and the lock range characteristic $l_2$ (broken line) are asymmetric with respect to the frequency $f_o$ (19 KHz) of a pilot signal included in a composite signal transmitted from an FM stereophonic broadcast station. (Although all the sets of the demodulator MC131OP do not exhibit the depicted characteristics but they are somewhat dispersed, the tendency as stated above is seen.)

Where the capture range and the lock range are the asymmetric characteristics in this manner, the allowable range of the dispersion of the self-oscillation frequency of a voltage controlled oscillator (VCO) of the PLL circuit is determined by the capture range which is smaller, and hence, the yield of the product lowers. Moreover, the centers of distributions are inconsistent, so that such characteristics are separation are degraded by a slight secular change etc.

The inventors analyzed the cause therefor. As the result, the following conclusion has been found.

Regarding the load transistors of the differential amplifier circuit uses as the D.C. amplifier in the PLL FM demodulator (MC131OP), as already explained, the transistor for the provision of the output has the multicollector structure, whereas the transistor not for the same has the single-collector structure with the ring-shaped collector region. For this reason, the load transistors $Q_4$ and $Q_6$ to supply the constant currents differ in the current gain $h_{FE}$. In consequence, even when differential inputs to be impressed on the amplifying transistors $Q_1$ and $Q_2$ are balanced, current from the two transistors $Q_4$ and $Q_6$ do not become equal and the so-called offset current arises.

Figure 8:
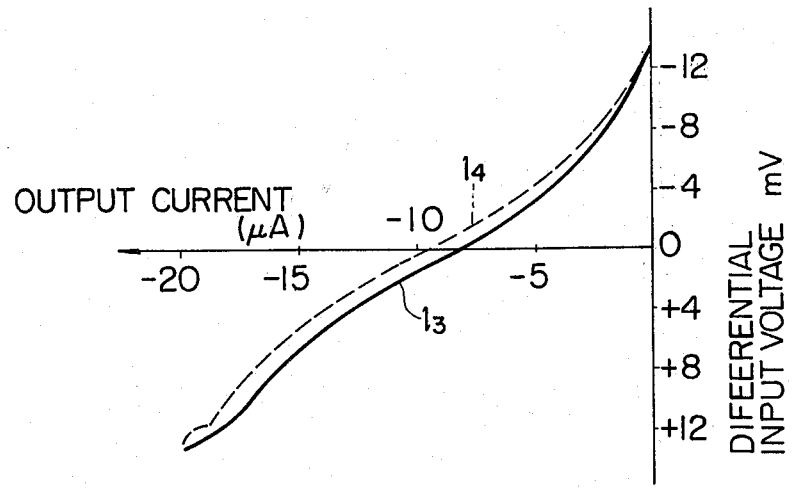
FIG. 8 is a graph which shows transfer characteristic curves of the prior-art differential amplifier circuit in FIG. 5 and the differential amplifier circuit of this invention in FIG. 1.

This will be apparent from a differential input voltage - output current transfer characteristic $l_3$ (full line) in the differential amplifier circuit as shown in FIG. 8. That is, when the differential input voltage is zero, the output current deviates from the middle point ($-10$ $\mu A$) on its right.

SUMMARY OF THE INVENTION

This invention has been brought forth as the result of the above study, and it has for its object to improve the differential input voltage - output current transfer characteristic of a transistor differential amplifier circuit which delivers an output from only one load transistor.

The fundamental construction of this invention for accomplishing the object is characterized by comprising a first transistor and a second transistor which are of a first conductivity type, a third transistor and a fourth transistor each of which is of a second conductivity type lateral structure including at least a first collector and a second collector, common impedance means, coupling means, a first power supply terminal, a second power supply terminal, and output means, respective emitters of said first and second transistors being differentially connected and being connected through said common impedance means to said second power supply terminal, collectors of said first and second transistors being respectively connected to the first collectors of said third and fourth transistors, emitters of said third and fourth transistors being respectively connected to said first power supply terminal, respective bases of said third and fourth transistors being coupled each other through said coupling means, said second collector of said third transistor being connected to said second power supply terminal, said second collector of said fourth transistor being connected to said output means, said output means providing therefrom an output signal which is a difference component between two input signals applied to bases of said first and second transistors.

PREFERRED EMBODIMENTS OF THE INVENTION

Hereunder this invention will be concretely described along embodiments with reference to the drawing.

Figure 1:
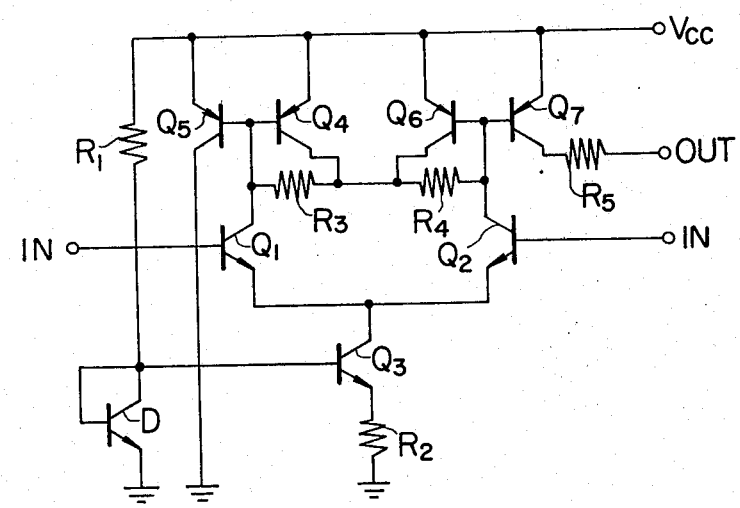
FIGS. 1 and 3 are circuit diagrams which show embodiments of this invention, respectively.

FIG. 1 is a circuit diagram showing an embodiment of this invention.

As illustrated in the figure, the transistor differential amplifier circuit according to this invention consists in a construction stated below.

The emitters of differential amplification transistors $Q_1$ and $Q_2$ are connected in common. The common emitters are grounded through a constant-current circuit which is composed of resistances $R_1$ and $R_2$, a diode D and a transistor $Q_3$. Shown at $Q_4$, $Q_5$ and $Q_6$, $Q_7$ are p-n-p lateral transistors of the multicollector structure in which bases and emitters are formed by respective common semiconductor regions. The collectors of the amplifying transistors $Q_1$ and $Q_2$ are respectively connected to the common bases of the multicollector transistors $Q_4$, $Q_5$ and $Q_6$, $Q_7$. Among the transistors $Q_4$–$Q_7$ of the multicollector structure, the corresponding transistors $Q_4$ and $Q_6$ have their collectors connected in common, and resistances $R_3$ and $R_4$ are connected between the bases and collectors of the respective transistors $Q_4$ and $Q_6$. One $Q_7$ of the corresponding transistors $Q_5$ and $Q_7$ has its collector connected to an output terminal OUT through a resistance $R_5$, while the other transistor $Q_5$ has its collector grounded. The bases of the transistors $Q_1$ and $Q_2$ are respectively connected to input terminals IN.

Figure 2:
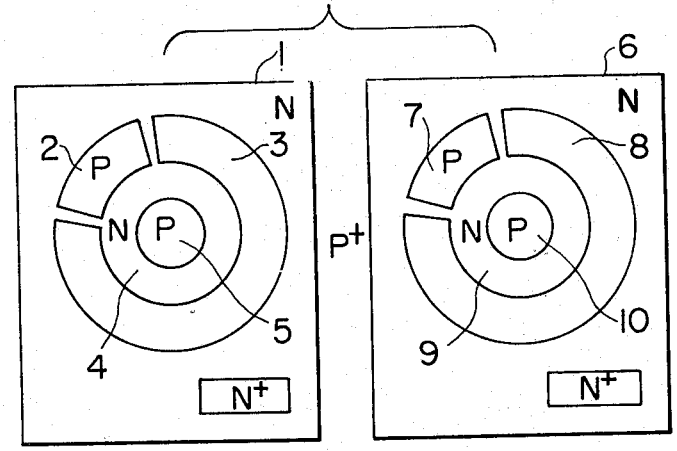
FIG. 2 shows an example of the pattern illustration of load transistors for use in the differential amplifier circuit according to this invention.

In the circuit of the above construction, the two sets of p-n-p lateral transistors $Q_4$, $Q_5$ and $Q_6$, $Q_7$ employed as load means are made structures of equal dimensions as shown by way of example in FIG. 2. More specifically the transistors $Q_4$ and $Q_5$ are fabricated as a transistor 1 of the multicollector structure in which a P-type emitter region 5 and an N-type base region 4 are respectively utilized as the common emitters and the common bases. A P-type collector region 3 forms the collector of the transistor $Q_4$, while a P-type collector region 2 forms the collector of the transistor $Q_5$. Likewise, the transistors $Q_6$ and $Q_7$ are fabricated as a transistor 6 of the multicollector structure in which a P-type emitter region 10 and an N-type base region 9 are respectively utilized as the common emitters and the common bases. A P-type collector region 8 forms the collector of the transistor $Q_6$, while a P-type collector region 7 forms the collector of the transistor $Q_7$. As apparent from FIG. 2, the two P-N-P lateral transistors 1 and 6 of the multicollector structure are made substantially equal to each other in the emitter-base junction area, the base width, the areas of two collector-base junctions, etc.

According to this invention as explained above, the object can be achieved for the following reason.

Since the transistors $Q_4$ and $Q_6$ for supplying the constant currents are formed so as to be structurally identical, their current gains $h_{FE}$ are substantially equal. Consequently, the offset current as previously explained does not arise when the differential input voltage is zero. This will be apparent from the differential input voltage - output current transfer characteristic $l_4$ (broken line) of the differential amplifier circuit according to this invention as illustrated in FIG. 8. With the differential amplifier circuit of this invention, the output current at the time when the differential input voltage is zero is substantially coincident with the middle point ($-10$ $\mu$A). The characteristic $l$ in this invention is considerably better than the characteristic $l_3$ in the prior art.

It is very significant and is to be noted that, in this invention, the collector of the transistor $Q_5$ corresponding to the transistor $Q_7$ for providing the output is grounded. The desirable characteristic according to this invention is not acquired when the load transistors 1 ($Q_4$, $Q_5$) and 2 ($Q_6$, $Q_7$) connected to the respective collectors of the differential amplifier transistors $Q_1$ and $Q_2$ are merely made the symmetric strutures, with the collector of the transistor $Q_5$ floated electrically. This will be understood from the ensuing exmplnation.

Where the transistor $Q_5$ is merely formed and its collector is kept electrically floated, it will operate in the saturation region. A current from the common emitter of the multicollector transistor will flow more towards a P$^+$-type isolation region of the semiconductor integrated circuit device as situated outside the collector. This will exert an influence on the base-emitter forward voltage $V_{BE}$. As the result, the transistor $Q_4$ possessing the emitter and base in common with the transistor $Q_5$ will have its current gain $h_{FE}$ lowered sharply. The balance between the current gains $h_{FE}$ of the transistor $Q_4$ and the corresponding transistor $Q_6$ will be lost. The differential input voltage - output current transfer characteristic will become rather inferior.

When the differential amplifier circuit according to this invention is utilized as the D.C. amplifier of the "PLL FM demodulator" previously referred to, the capture range and lock range characteristics of the PLL circuit become bisymmetric with respect to the frequency $f_o$ of the pilot signal, and the yield of the demodulator is enhanced. In addition, the separation characteristic etc. are not degraded even when the demodulator undergoes some extent of secular changes etc., and the enhancement of performance is achieved.

This invention is not restricted to the foregoing embodiment, but it can adopt various aspects of performance.

Figure 3:
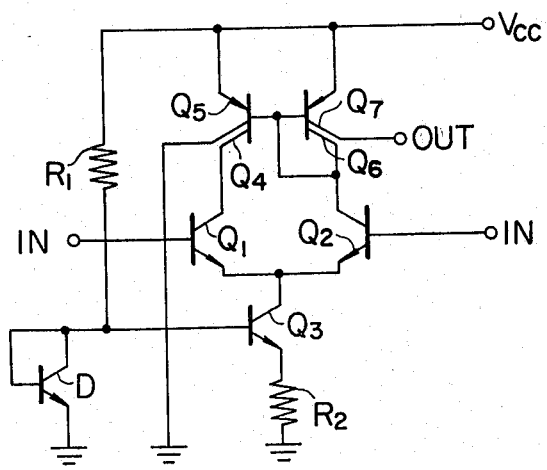

For example, the invention is also applicable to the fundamental differential amplifier circuit as illustrated in FIG. 3. When, with the amplifier circuit provided with two output terminals as shown in FIG. 4 or FIG. 5, the output is to be derived from only one of the output terminals, the other output terminal shall be grounded.

This invention can be extensively utilized for the general differential amplifier circuits.

I claim:

1. A transistor differential amplifier circuit comprising a first transistor and a second transistor which are of a first conductivity type, a third transistor and a fourth transistor each of which is of a second conductivity type lateral structure including at least a first collector and a second collector, common impedance means, a first power supply terminal, a second power supply terminal, and output means, respective emitters of said first and second transistors being differentially connected and being connected through said common impedance means to said second power supply terminal, collectors of said first and second transistors being respectively connected to the first collectors of said third and fourth transistors, emitters of said third and fourth transistors being respectively connected to said first power supply terminal, said second collector of said third transistor being connected to said second power supply terminal, said second collector of said fourth transistor being connected to said output means, said output means providing therefrom an output signal which is a difference component between two input signals applied to bases of said first and second transistors.

2. A transistor differential amplifier circuit according to claim 1, wherein said bases of said third and fourth transistors are directly coupled to each other and are directly coupled to said collector of said second transistor.

3. A transistor differential amplifier circuit according to claim 1, wherein said common impendance means comprises a constant-current circuit.

4. A transistor differential amplifier circuit according to claim 3, wherein said first and second transistors are n-p-n transistors, and said third and fourth transistors are p-n-p lateral transistors of the multicollector structure.

5. A transistor differential amplifier circuit according to claim 1, wherein the collector of said first transistor is connected to the first collector of said third transistor through a first resistive means and is connected to the base of said third transistor, the collector of said second transistor is connected to the first collector of said fourth transistor and is connected to the base of said fourth transistor, and respective first collectors of said third and fourth transistors are connected to each other.

6. A transistor differential amplifier circuit according to claim 5, wherein said common impedance means comprises a constant-current circuit.

7. A transistor differential amplifier circuit according to claim 6, wherein said first and second transistors are n-p-n transistors, and said third and fourth transistors are p-n-p lateral transistors of the multicollector structure.

* * * * *